United States Patent
Masayuki et al.

(10) Patent No.: US 6,663,969 B2
(45) Date of Patent: Dec. 16, 2003

(54) HEAT CONDUCTIVE ADHESIVE FILM AND MANUFACTURING METHOD THEREOF AND ELECTRONIC COMPONENT

(75) Inventors: Tobita Masayuki, Tokyo (JP); Shinya Tateda, Tokyo (JP); Tsuneh isa Kimura, Chohu (JP); Masahumi Yamato, Hachioji (JP)

(73) Assignee: Polymatech Co., Ltd., Tokyo (JP)

( * ) Notice: Subject to any disclaimer, the term of this patent is extended or adjusted under 35 U.S.C. 154(b) by 1 day.

(21) Appl. No.: 09/921,427

(22) Filed: Aug. 2, 2001

(65) Prior Publication Data
US 2002/0050585 A1 May 2, 2002

(30) Foreign Application Priority Data
Aug. 31, 2000 (JP) ........................................ 2000-264439

(51) Int. Cl.$^7$ ............................................... B32B 27/38
(52) U.S. Cl. .................... 428/414; 428/413; 428/447; 428/473.5; 428/500; 523/445; 523/500; 523/514; 528/13
(58) Field of Search ............................. 428/413, 423.1, 428/447, 473.5, 500, 910; 523/445, 500, 514; 528/13

(56) References Cited

U.S. PATENT DOCUMENTS

| 4,626,371 A | * | 12/1986 | Ikenaga et al. | .......... | 252/62.54 |
| 4,726,998 A | * | 2/1988 | Ikenaga et al. | ............. | 428/480 |
| 6,198,901 B1 | * | 3/2001 | Watanabe | ................... | 399/328 |

FOREIGN PATENT DOCUMENTS

JP     HEI 11-87482     10/2000

* cited by examiner

*Primary Examiner*—Robert Dawson
*Assistant Examiner*—Christopher M Keehan
(74) *Attorney, Agent, or Firm*—McGlew and Tuttle, P.C.

(57) ABSTRACT

A heat conductive adhesive film, wherein a magnetic field is applied to a film composition comprising boron nitride powder for orientating and solidifying the boron nitride powder in the composition in a given direction, an manufacturing method thereof, and an electronic component, characterized by that a heat radiating element and a heat conductive member are adhered by a heat conductive adhesive film wherein boron nitride powder is orientated in a given direction, presenting a high heat conductivity, an excellent heat radiation, and a good electric insulation and a high peeling-off strength.

9 Claims, 5 Drawing Sheets

HEAT CONDUCTIVE ADHESIVE FILM AND MANUFACTURING METHOD THEREOF AND ELECTRONIC COMPONENT

BACKGROUND OF THE INVENTION

1. Technical Field of the Invention

The present invention concerns a heat conductive adhesive film requiring a high heat conductivity and a manufacturing method thereof and an electronic component. More particularly, an electrically insulating heat conductive adhesive film capable of dissipating heat generated from components such as semiconductor devices, power source, light source of others used for electric products and an manufacturing method thereof and electronic components excellent in heat radiation.

2. Related Art

Conventionally, various kinds of heat conductive adhesive film have been used for joining heat generating semiconductor devices and heat radiating conductive members, or insulating substrate and metal foil or electrode or the like. In order to increase the heat conductivity, these heat conductive adhesive films have silver, copper, gold, aluminum or other metals and alloys, compounds of high heat conductivity, or aluminum oxide, magnesium oxide, silicon oxide, boron nitride, aluminum nitride, silicon nitride, silicon carbide or other electrically non-conductive ceramics, carbon black, graphite, diamond or other powder particle form or fiber form heat conductive fillers, blended therein.

Among them, electrically non-conductive heat conductive adhesive films filled with boron nitride powder, aluminum oxide powder, aluminum nitride powder or the like, excellent in heat conductivity and electric insulation are largely made fit for practical use.

PROBLEMS TO BE SOLVED BY THE INVENTION

However, hexagonal boron nitride powder is scaled (thin leaf), and the heat conductivity in its thickness direction (perpendicular to the face) is smaller than the heat conductivity in its plane direction (horizontal to the face) and in case of adhesive film obtained by blending simply boron nitride powder with solid state adhesive and smeared, an adhesive film presenting a sufficient heat conductivity could not be obtained by this simple method, because the plane direction of scaled boron nitride powder is charged into the adhesive film in parallel with the plane direction.

In short, as adhesive films presenting a good electric insulation and a high heat conductivity are not developed, an electrochemical migration was accelerated or corrosion of wiring or pad sections was facilitated by a great amount of heat generated from electronic components such as semiconductor device, composing material cracked or broken, or the interface of the junction of composing material came off due to the generated heat stress, causing various troubles deteriorating the life of electronic components.

Certainly, in the heat conductive adhesive film of Japanese Patent Application No. HEI 11-87482 by the same Applicant as, a diamagnetic filler of 20 W/m·K or more in heat conductivity was orientated in a given direction in a solid state adhesive, however, the boron nitride powder was not considered as diamagnetic filler.

MEANS TO SOLVE THE PROBLEMS

As the results of diligent and devoted studies in order to solve the aforementioned problems, a manufacturing method of a heat conductive adhesive film taking profit of the characteristics that the heat conductive adhesive film having boron nitride powder orientated in a given direction in a solid state adhesive is excellent in electric insulation and heat conductivity, and that boron nitride powder orientates along the lines of magnetic force in the magnetic field, and an electronic component excellent in heat radiation using the same are to be provided.

Namely, the present invention is a heat conductive adhesive film characterized by that boron nitride powder is orientated in a given direction in a solid state adhesive.

Further, the present invention is a manufacturing method of a heat conductive adhesive film characterized by that a magnetic field is applied to a film composition including boron nitride powder to orientate and solidify the boron nitride powder in the composition in a given direction, and, an electronic component characterized by that a heat generating element and a heat conductive member is adhered with a heat conductive adhesive film having boron nitride powder orientated in a given direction.

Boron nitride powder used in the invention is not specified for the kind of crystalline system, shape and size of powder grain, cohesion degree of powder particle and their distribution. As for the crystalline system, boron nitride powder of hexagonal system, cubic system, wurtzite structure, rhombohedral system, or any other structure can be used. Among them, boron nitride powder of easily available hexagonal system presenting an heat conductivity of some 10 to 100 W/m·K or so, or of cubic structure presenting an extremely high heat conductivity of 1300 W/m·K maximum, are preferable.

The particle shape of boron nitride powder is not limited to scaled, or flat shape, but boron nitride powder of various particle forms such as granular, lump, spheric, fiber, whisker shaped boron nitride powder or ground product of them can be used. The particle diameter of boron nitride powder is neither specified; however, the individual average primary diameter in the range of 0.01 to 100 $\mu$m, or more preferably, in the range of 0.1 to 20 $\mu$m can be used. Finer than 0.01 $\mu$m, it becomes difficult to charge in quantity into the heat conductive adhesive film, and boron nitride powder larger than 100 $\mu$m is difficult to produce and disadvantageous in respect of the cost. It can not respond, when a thin adhesive layer is required. In case of scaled boron nitride powder, a range of 0.5 to 50 $\mu$m as maximum diameter can be easily blended in the film and magnetic field orientated and fit for practical use. Moreover, boron nitride powder of the structure of cohered primary particle is also used.

The concentration of boron nitride powder in the heat conductive adhesive film is preferably 2 to 80 volume % If less than 2 volume %, the improvement effect of heat conductivity is low, and if contained by 80 volume % or more, the viscosity of the composition increases, the fluidity decreases, making the handling difficult, and air bubbles enter inevitably, making impossible to manufacture the desired heat conductive adhesive film, so it is not appropriate. More preferably, the concentration of boron nitride powder in the heat conductive adhesive film is 5 to 50 volume % still more preferably, 10 to 40 volume %. It is also possible to increase the concentration by using boron nitride powders of different power particle diameters at the same time, or surface treatment.

As solid state adhesive used for the invention, material made of publicly known resin or rubber such as epoxy, polyimide, acrylic, vinyl such as polyvinylacetate, urethane, silicone, olefin, polyamide, polyamide-imide, phenol, amino, bismaleimides, polyimide silicone, saturated and non-saturated polyester, diallyl phthalate, urea, melamine, alkyd, benzocyclobutene, synthetic rubber such as polybutadiene or chloroprene, nitrile rubber, natural rubber, styrenic base elastomer or the like that are solid at the room temperature, or become solid in semi-setting state by heating are preferable.

For setting mode, adhesive polymer of any known curing mode, including thermosetting, ultraviolet or visible light setting, room temperature setting, hygrosetting or the like can be used. Among others, at least one kind of heat setting solid state adhesive selected from epoxy, polyimide, acrylic, urethane, silicone based ones that adhere well to various metals, ceramics, plastic material, rubber or elastomer of the material composing the electronic component is preferable.

Further, in case of thermosetting solid state adhesive, a heat conductive adhesive film made to the half set state such as B stage after having blended boron nitride powder and orientated into a given direction, is preferable in respect of adhesion strength and reliability. Also, it is possible to obtain a heat conductive adhesive film presenting an improved wettability with the solid state adhesive or an improved fillability by treating the surface of boron nitride powder with a publicly known coupling agent, in view of surface treatment of the boron nitride powder.

Solvent, thixotropic agent, dispersion agent, hardener, crosslinling accelarator, retarder, adherent, plasticizer, fire retardant, antioxidant, stabilizer, pigment or other known additives can be blended in the heat conductive adhesive film of the invention. Especially, in case when a composition wherein a solid state adhesive and boron nitride powder are blended presents a high viscosity, the magnetic field orientation of the boron nitride powder can be accelerated by lowering the viscosity of the composition by adding a solvent.

Powder form or fiber form metal or ceramics, to be more specific, silver, copper, gold, aluminum oxide, magnesium oxide, silicon nitride, silicon carbide and metal coated resin or other fillers used for the conventional heat conductive film can be used conveniently at the same time. However, it is rather undesirable to mix fillers such as metals presenting a high electric conductance, because an excellent electric insulation is one of characteristics of the heat conductive adhesive film of the invention.

The film thickness is not specified, however, a range of 10 $\mu$m to 2 mm is preferable. In case of orientating boron nitride powder to be blended in the thickness direction, it is preferable that the film thickness is thicker than the maximum length of orientation of orientating boron nitride powder to be used, for flattening the heat conductive adhesive film.

BRIEF DESCRIPTION OF DRAWINGS

FIGS. 5(1) to (3) are schematic diagrams showing a manufacturing method of the heat conductive adhesive film of the present invention;

FIGS. 6(1) to (4) are schematic diagrams showing a manufacturing method of the electronic component of the present invention and (5) the orientation state of boron nitride powder in the heat conductive adhesive film;

DETAILED DESCRIPTION OF THE PREFERRED EMBODIMENTS

Methods for orientating boron nitride powder into a given direction in a solid state adhesive include a method using fluid field or shearing field, a method using magnetic field, or a method using electric field.

Boron nitride powder can be orientated into the given direction in the solid state adhesive, and the heat conductive adhesive film of the invention can be obtained.

However, in the present invention, a method for applying magnetic field for orientating boron nitride powder, by using the anisotropic diamagnetic susceptibility of boron nitride powder can orientate effectively boron nitride powder especially in an arbitrary direction, and is appropriate as method for manufacturing simply a heat conductive adhesive film presenting a good heat conductivity.

In other words, it is a characteristic of the manufacturing method of heat conductive adhesive film of the present invention to apply magnetic field to a film composition containing boron nitride powder, and orientate boron nitride powder into a given direction in the composition for solidification.

A heat conductive adhesive film, presenting an improved heat conductive adhesive film in a given direction can be obtained by orientating boron nitride powder in the composition along the lines of magnetic force applying an external magnetic field and taking profit of a high heat conductivity of the orientated boron nitride powder.

For example, in order to orientate boron nitride powder in the thickness direction of a heat conductive adhesive film (direction perpendicular to the plane), the N pole and the S pole of a permanent magnet or electromagnet are places in opposition in the thickness direction, so that the orientation of lines of magnetic force corresponds to a desired orientation of boron nitride powder.

On the other hand, in order to improve the heat conductance in the given direction in a vertical direction orthogonal to a plane in the plane of the heat conductive adhesive film and in a horizontal direction parallel to the plane, or in a direction parallel to the vertical and horizontal plane, boron nitride powder can be orientated in a direction parallel to the plane in the plane by opposing the N pole and the S pole of the magnet in a direction orthogonal to the plane. Otherwise, boron nitride powder can be aligned in parallel with the plane in the plane by opposing the N pole and the N pole or the S pole and the S pole of the magnet in the thickness direction. In addition, the lines of magnetic force are not necessarily straight, but they may be curbed, rectangular or in two directions or more.

In short, an anisotropy of heat conductivity can be afforded by orientating boron nitride powder in an arbitrary given direction. Moreover, magnets are not necessarily opposed at both sides, but it is also possible to orientate boron nitride powder in the film composition by magnets disposed only on one side.

The magnetic field generation means used as external magnetic field may be a permanent magnet or electromagnet or coil, and an range of magnetic flux density of 0.05 tesla to 30 tesla allows to achieve a practical orientation of boron nitride powder.

In addition, as an extremely weak diamagnetic anisotropic susceptibility of boron nitride powder is used in the invention, it is necessary to orientate sufficiently boron nitride powder in a stronger magnetic atmosphere, before solidifying the matrix by thermosetting reaction or cooling. A preferable magnetic flux density for easy orientation is equal or superior to 0.5 tesla, and more preferably, equal or superior to 1 tesla.

Still more boron nitride powder can be dissipated and mixed easily, and still higher heat conductivity of the obtained heat conductive adhesive film can be achieved, by a preliminary degreasing or washing treatment of the surface of boron nitride powder, or by the surface treatment with silane, titanium or aluminum base coupling agent or the like, in order to improve the wettability or adhesion between the boron nitride powder and the solid state adhesive.

The electronic component of the invention can be manufactured by adhering a heat generating element and a heat conductive member by the heat conductive adhesive film of the invention. The heat conductive member includes an ordinary radiator, cooler, heat sink, heat spreader, lead frame, die pad, print circuit board, cooling fan, heat pipe, case or the like. It can also be used for adhering metal foils, electrodes or others for printed circuit board, such as copper foil.

Now, the invention will be described still in detail based on embodiments. In the embodiments and comparative examples the heat conductivity was measured by the laser flash method. Copper foil 90 degree peeling-off strength was measured with a sample, sandwiched between a copper foil of 35 μm in thickness and an aluminum plate of 1.5 mm in thickness according to JISC 6471, heated and adhered under a pressure of 2 Mpa, 170° C., 30 min. The volume resistance was measured according to JIS (Japanese Industrial Standard)-K6911.

Embodiment 1

100 weight parts of methyl ethyl ketone are added to the same weight parts of composition of epoxy base solid state adhesive obtained by blending 45 weight parts of bisphenol A type epoxy resin (made by Japan Epoxy Resins Co., Ltd.: Epikote 828), 15 weight parts of cresol novolac type epoxy resin (made by Sumitomo Chemical Co., Ltd.: ESCN001), 40 weight parts of bisphenol A type novolac resin (made by Dainippon Ink & Chemicals, Inc.: LF2882) as hardener, and 1 weight part of 1-cyanoethyl-2-methylimidasol (made by Shikoku Corp.: Curezol 2PN-CN) as accelerator, then boron nitride powder (made by Showa Denko K. K.: UHP-S 1: average particle diameter 1 to 2 μm) is mixed so that the concentration of boron nitride powder in the final heat conductive adhesive film would be 13 volume %, kneaded by a tri-roller, and then degassed under vacuum.

The obtained epoxy base heat conductive adhesive film is applied by the doctor blade method onto a polyethylene terephthalate sheet 11 of 100 μm in thickness whose one surface is released from the die, heated and dried at 110° C. for 15 min in a magnetic atmosphere where the N pole and the S pole of 6 tesla in magnetic flux density from magnets 12 are opposed in the thickness direction as shown in FIG. 5(1) to FIG. 5(3), to manufacture a B stage state heat conductive adhesive film 3 of 120 μm in thickness.

The heat conductivity in the thickness direction of a simple heat conductive adhesive film was 1.8 W/m·K, 90 degree peeling-off strength 1.4 kN/m, and the volume resistance $10^{12}$ Ω·cm.

Figure 1:
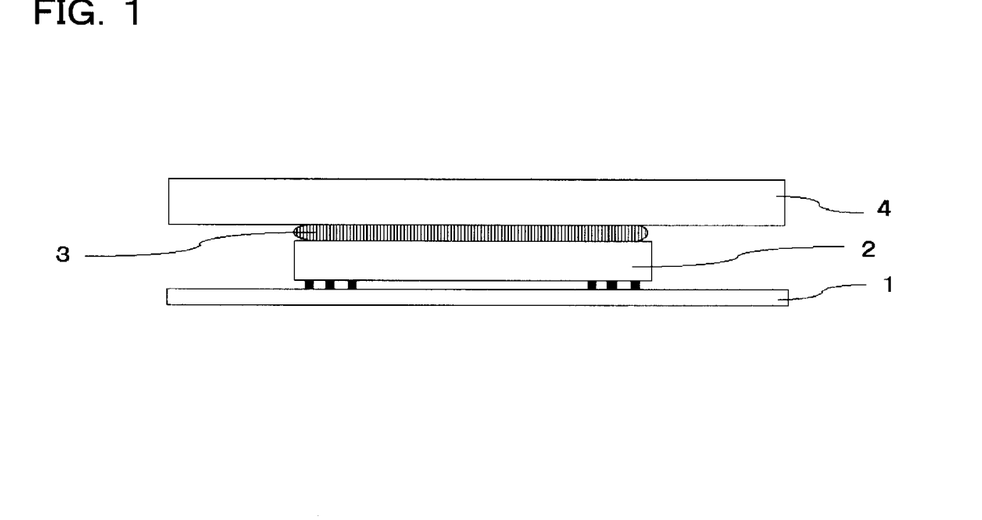
FIG. 1 shows an example of electronic component using the heat conductive adhesive film of the present invention (used for adhesion between ball grid array type semiconductor package 2 and radiator 4)
Figure 2:
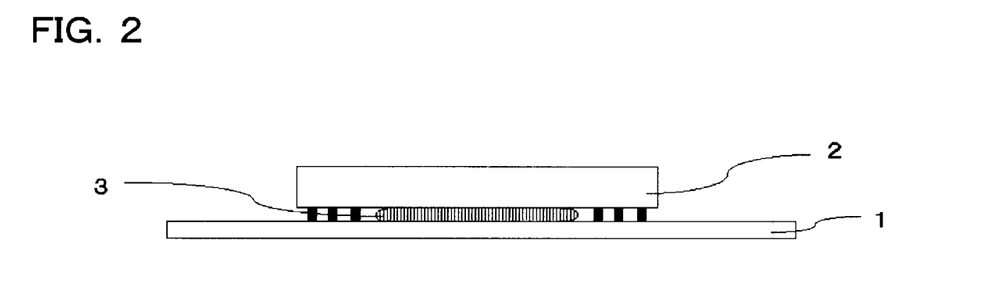
FIG. 2 shows an example of electronic component using the heat conductive adhesive film of the present invention (used for adhesion between chip size semiconductor package 2 and print circuit board 1)
Figure 3:
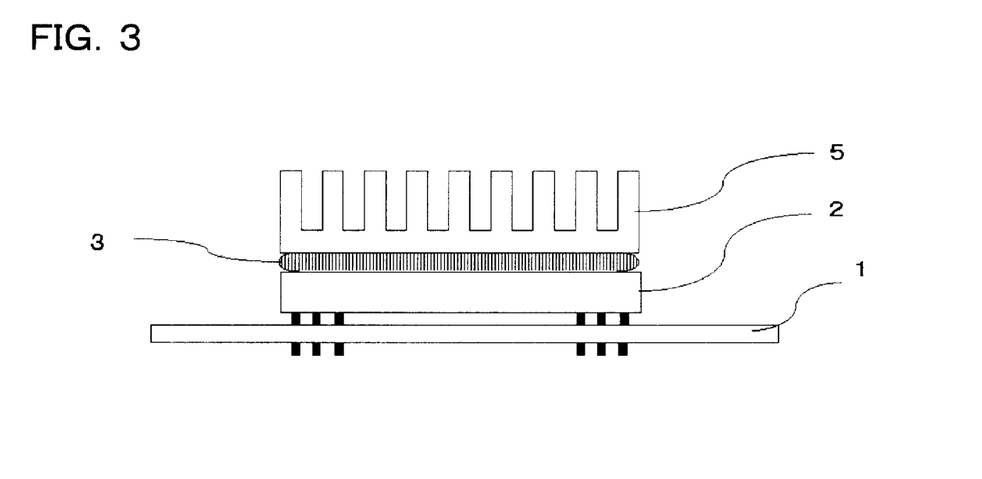
FIG. 3 shows an example of electronic component using the heat conductive adhesive film of the present invention (used for adhesion between pin grid array type semiconductor package 2 and heat sink 5)

An example of electronic component obtained by adhering a ball grid type semiconductor package 2 and a radiator 4 by the heat conductive adhesive film 3 is shown in FIG. 1. FIG. 2 shows a chip size semiconductor package 2 and a printed board 1. FIG. 3 shows a pin grid array type semiconductor package 2 and a heat sink 5.

Embodiment 2

100 weight parts of mixed medium of toluene and methyl ethyl ketone are added to the same weigh parts of composition of acrylic base solid state adhesive comprising 30 weight parts of methyl methacrylate, 40 weight parts of 2-hydroxy methacrylate, 30 weight parts of styrenic base thermoplastic elastomer (made by Shell Chemical Industry, Co., Ltd.: Kraton G1650), and 3 weight parts of Perhexa 3M (made by Nippon Yushi Co., Ltd.) as hardener, then boron nitride powder (made by Showa Denko K. K.: UHP-S1: average particle diameter 1 to 2 μm) is mixed so that the concentration of boron nitride powder in the final heat conductive adhesive film would be 13 volume %, kneaded by a tri-roller, and then degassed under vacuum.

The obtained acrylic base heat conductive adhesive film is applied by barcoater method onto a polyethylene terephthalate sheet of 100 μm in thickness whose one surface is released from the die, heated and dried at 120° C. for 20 min in a magnetic atmosphere where the N pole and the S pole of 6 tesla in magnetic flux density are opposed in the thickness direction as shown in FIG. 5(1) to FIG. 5(3), to manufacture a B stage state heat conductive adhesive film 3 of 120 μm in thickness.

The heat conductivity and 90 degree peeling-off strength of the obtained heat conductive adhesive film were measured, and the results were noted in Table 1. The heat conductivity, 90 degree peeling-off strength and volume resistance were evaluated similarly as for the embodiment 1 and the results were noted in Table 1.

Embodiment 3 to 12

Heat conductive adhesive films 3 were manufactured under the magnetic flux density conditions of Table 1 using the composition made of boron nitride powder concentrations noted in Table 1, with an epoxy base heat conductive adhesive film similar to the embodiment 1 of the concentration described in Table 1, or with an acrylic base heat conductive adhesive film similar to the embodiment 2, similarly as the embodiment 1.

For the kind of solid state adhesive of the heat conductive adhesive film described in Table 1, a thermosetting type polyimide was used as polyimide, a thermosetting type two component urethane as urethane base, and a addition type liquid silicone rubber as silicon.

The heat conductivity, 90 degree peeling-off strength and volume resistance were evaluated similarly as for the embodiment 1 and the results were noted in Table 1.

Comparative Example 1

100 weight parts of methyl ethyl ketone are added to the same weigh parts of composition of epoxy base solid state adhesive obtained by blending 45 weight parts of bisphenol A type epoxy resin (made by Japan Epoxy Resin Co., Ltd.: Epikote 828), 15 weight parts of cresol novolac type epoxy resin (made by Sumitomo Chemical Co, Ltd.: ESCN001), 40 weight parts of bisphenol A type novolac resin (made by Dainippon Ink & Chemicals, Inc.: LF2882) as hardener, and 1 weight part of 1-cyanoethyl-2-methylimidazol (made by Shikoku Corp.: Curezol 2PN-CN) as accelerator, then boron nitride powder (made by Showa Denko K. K.: UHP-S1: average particle diameter 1 to 2 $\mu$m) is mixed so that the concentration of boron nitride powder in the final hear conductive adhesive film would be 13 volume %, kneaded by a tri-roller, and then degassed under vacuum.

The obtained composition was applied by the doctor blade method onto a polyethylene terephthalate sheet 11 of 100 $\mu$m in thickness whose one surface is released from the die, heated and dried at 110° C. for 15 min without impressing a magnetic field to manufacture a B stage state heat conductive adhesive film 3 of 120 $\mu$m in thickness.

The heat conductivity, 90 degree peeling-off strength and volume resistance were evaluated similarly as for the embodiment 1 and the results were noted in Table 1.

Comparative Example 2

The composition of epoxy base solid state adhesive wherein boron nitride powder (made by Showa Denko K. K.: UHP-S1: average particle diameter 1 to 2 $\mu$m) is mixed so that the concentration of boron nitride powder in the heat conductive adhesive film would be 13 volume % was used, heated and dried at 110° C. for 15 min in a magnetic atmosphere where the N pole and the S pole of 0.2 tesla in magnetic flux density are opposed in the thickness direction as in the embodiment 1, to manufacture a B stage state heat conductive adhesive film 3 of 120 $\mu$m in thickness.

The heat conductivity, 90 degree peeling-off strength and volume resistance were evaluated similarly as for the embodiment 1 and the results were noted in Table 1.

Comparative Example 3, 4

A film composition made of solid state adhesive of the concentration noted in Table 1 and boron nitride powder was prepared as in the Comparative example 1, and a heat conductive adhesive film was manufactured without affording magnetic field as in the comparative example 1.

The heat conductivity, 90 degree peeling-off strength and volume resistance were evaluated similarly as for the embodiment 1 and the results were noted in Table 1.

Embodiment 13

An electronic component 13 (FIG. 6(5)) was manufactured using the silicone base heat conductive adhesive film 3 of the embodiment 5 of the invention on a ball grid array type semiconductor package 2 that is mounted on a print circuit board shown in FIG. 6(1), disposing a radiator 4 in the upper part as in (FIG. 6(2) and FIG. 6(3)), and applying pressure and heat.

This electronic component 13 was turned on, and the heat resistance value was measured after 10 min, to obtain 0.27° C./W.

Comparative Example 5

Figure 7:
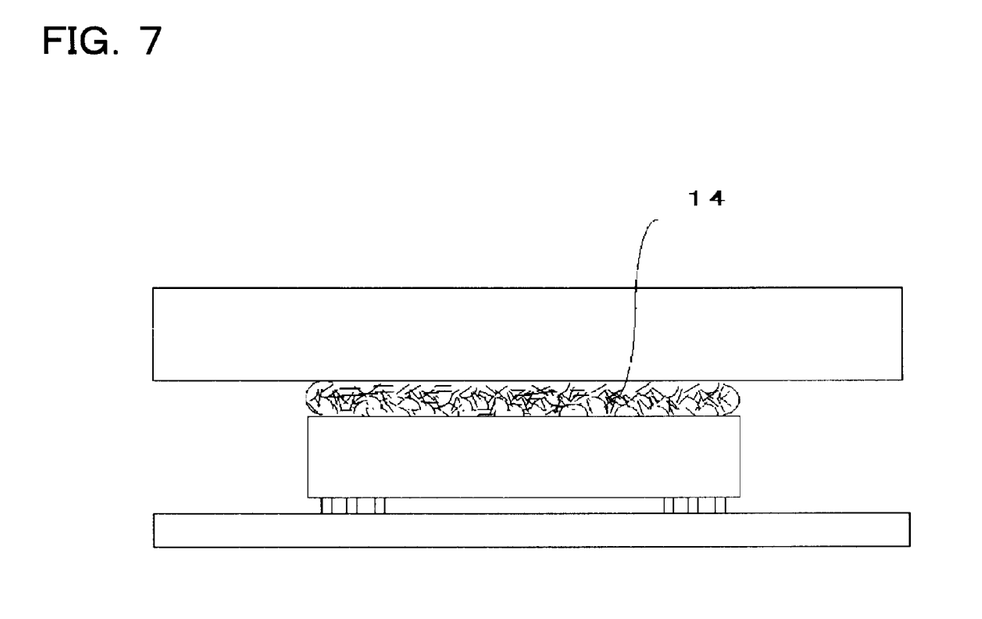
FIG. 7 shows an example of electronic component using the heat conductive adhesive film using a conventional filler.
Figure 8:
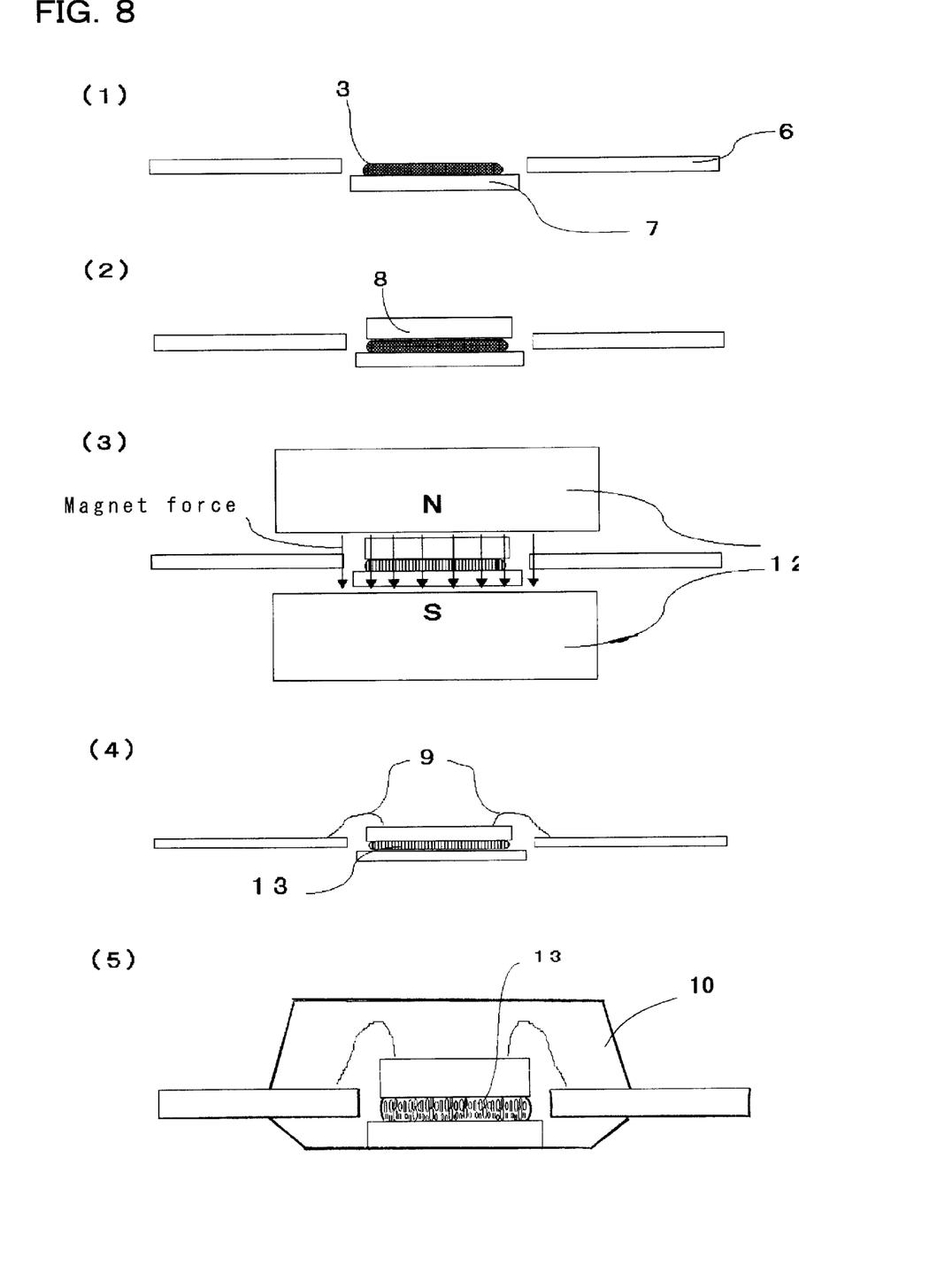
FIG. 8 shows a manufacturing method of the electronic component of the present invention of FIG. 4.

An electronic component 14 (FIG. 7) was manufactured, by using the silicone base heat conductive adhesive film 3 of the comparative example of Table 1 on a ball grid array type semiconductor package 2 that is mounted on a printed board, similarly as the embodiment 13, disposing a radiator 4 in the upper part, and applying pressure and heat.

This electronic component 14 was turned on, and the heat resistance value was measured after 10 min, to obtain 0.38° C./W.

Embodiment 14

Figure 4:
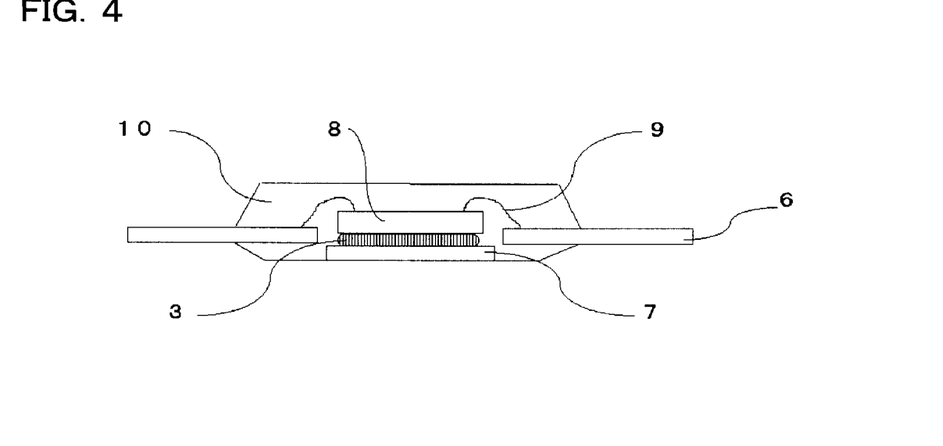
FIG. 4 shows an example of electronic component using the heat conductive adhesive film of the present invention (used for adhesion between semiconductor chip 8 and die pad 7)
Figure 5:
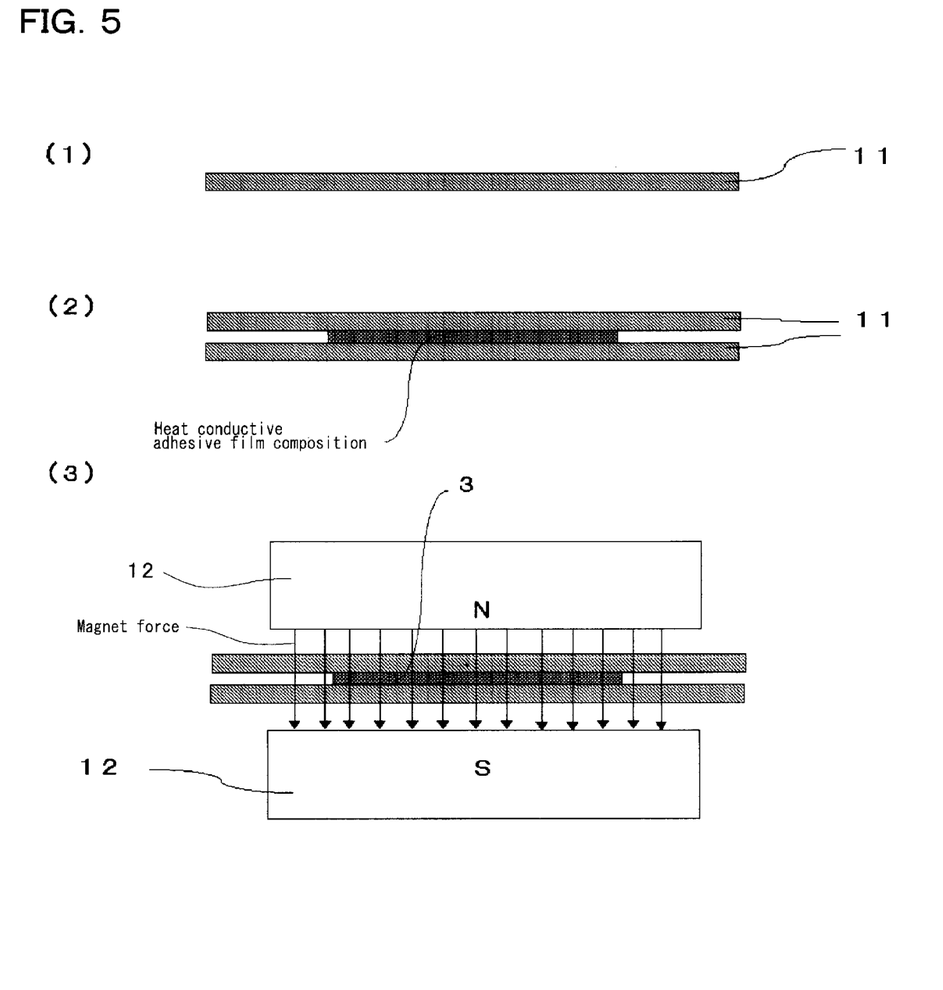
Figure 6:
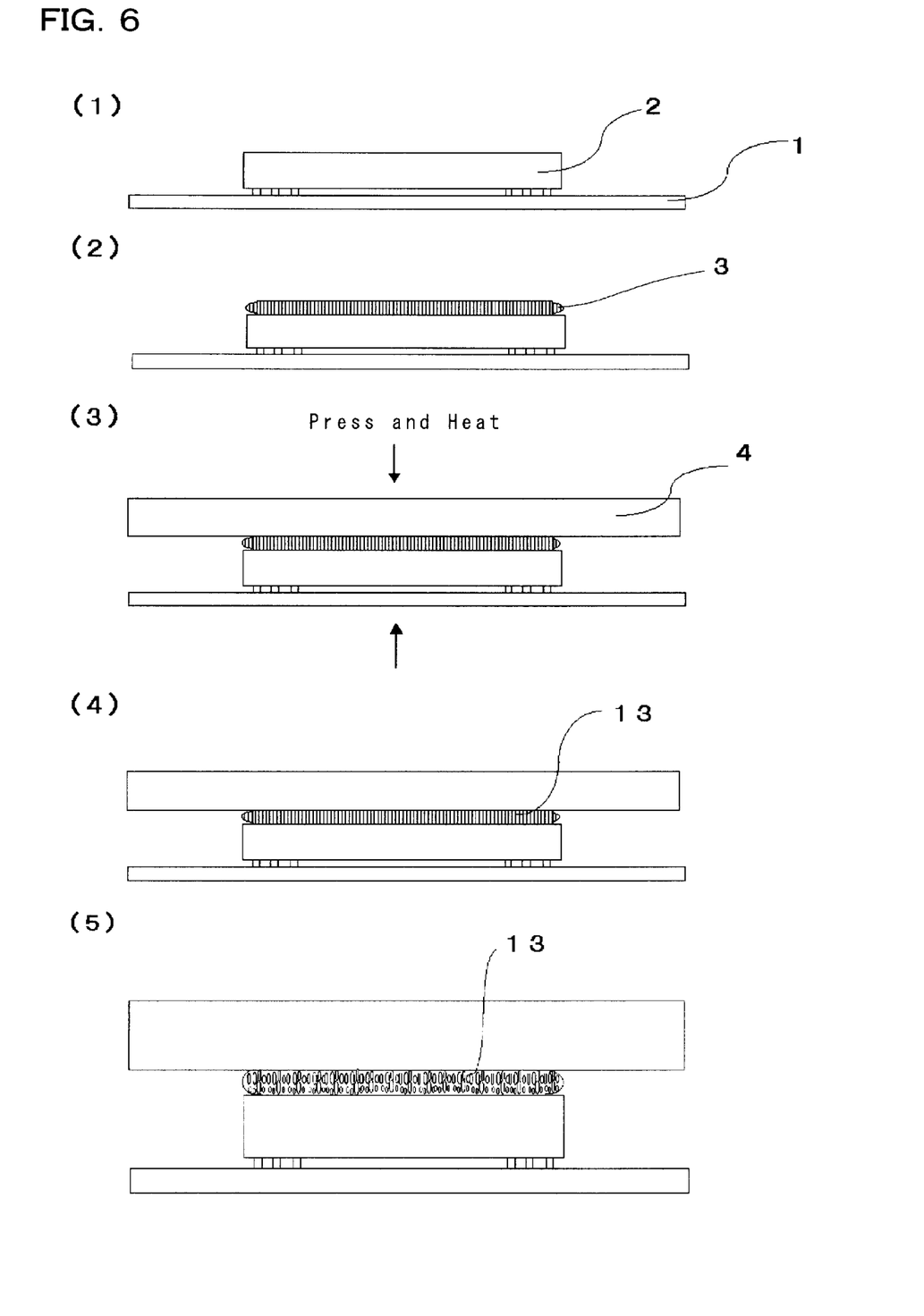

As shown in FIG. 8(1) and FIG. 8(2), the epoxy base heat conductive adhesive film 3 of the embodiment 1 of the invention is sandwiched between a die pad 7 of a lead frame 6 and a semiconductor chip 8, and heat set by applying a magnetic field of 6 tesla in magnetic flux density in the thickness direction by magnets 12 disposed as shown in FIG. 8(3). Then, the electrode section of the semiconductor chip 8 and the lead section of the lead frame 6 were connected electrically by a bonding wire 9 (FIG. 8(4)), and transfer molded with an epoxy sealant 10 to manufacture an electronic component (FIG. 4). FIG. 8(5) shows the state of orientation of boron nitride powder in the heat conductive adhesive film.

This electronic component was turned on, and the heat resistance value was measured after 10 min, to obtain 0.28° C./W.

Comparative Example 6

Similarly as the embodiment 14, the epoxy base heat conductive adhesive film 3 of the embodiment 1 of the invention is sandwiched between the die pad 7 of the lead frame 6 and the semiconductor chip 8 was heat set by the epoxy base heat conductive adhesive film 3 of the comparative example 1. Then, the electrode section of the semiconductor chip 8 and the lead section of the lead frame 6 were connected electrically, and transfer molded with the epoxy sealant 10 to manufacture the same electronic component as FIG. 4.

This electronic component was turned on, and the heat resistance value was measured after 10 min, to obtain 0.42° C./W.

TABLE 1

| Boron Nitride powder | Solid state adhesive | | | Magnetic orientation | | | |
|---|---|---|---|---|---|---|---|
| | | | | Magnetic flux density | Peeling-off strength | Heat conductivity | Volume resistance rate |
| Volume % | Kind | Volume % | Presence | (tesla) | (kN/m) | (W/m · K) | ($\Omega$ · cm) |
| Embodiment | | | | | | | |
| 1 | 13 | epoxy | 87 | present | 6 | 1.4 | 1.8 | $10^{12}$ |
| 2 | 13 | acrylic | 87 | present | 6 | 1.3 | 1.7 | $10^{13}$ |
| 3 | 13 | polyimide | 87 | present | 6 | 1.7 | 1.7 | $10^{12}$ |
| 4 | 13 | urethane | 87 | present | 6 | 1.2 | 1.8 | $10^{12}$ |

TABLE 1-continued

| | Boron Nitride powder | Solid state adhesive | | Magnetic orientation | | Peeling-off strength | Heat conductivity | Volume resistance rate |
|---|---|---|---|---|---|---|---|---|
| | | | | | Magnetic flux density | | | |
| | Volume % | Kind | Volume % | Presence | (tesla) | (kN/m) | (W/m · K) | (Ω · cm) |
| 5 | 13 | silicone | 87 | present | 6 | 0.8 | 2.1 | $10^{13}$ |
| 6 | 10 | epoxy | 90 | present | 6 | 1.5 | 1.2 | $10^{12}$ |
| 7 | 16 | epoxy | 84 | present | 10 | 1.2 | 2.4 | $10^{12}$ |
| 8 | 35 | epoxy | 65 | present | 18 | 1.5 | 3.8 | $10^{12}$ |
| 9 | 13 | epoxy | 87 | present | 2 | 1.4 | 1.2 | $10^{12}$ |
| 10 | 13 | epoxy | 87 | present | 4 | 1.4 | 1.5 | $10^{12}$ |
| 11 | 13 | epoxy | 87 | present | 10 | 1.5 | 2.0 | $10^{12}$ |
| 12 | 13 | acrylic | 87 | present | 10 | 1.4 | 1.9 | $10^{13}$ |
| Comparative example | | | | | | | | |
| 1 | 13 | epoxy | 87 | absent | 0 | 1.3 | 0.8 | $10^{12}$ |
| 2 | 13 | epoxy | 87 | present | 0.2 | 1.2 | 0.9 | $10^{12}$ |
| 3 | 13 | silicone | 87 | absent | 0 | 0.7 | 0.8 | $10^{13}$ |
| 4 | — | epoxy | 100 | absent | 0 | 1.4 | 0.2 | $10^{12}$ |

The heat conductivity is low for the comparative example 4, example without blending boron nitride powder. In the comparative example 1 and the comparative example 3, examples of heat conductive adhesive film though blending boron nitride powder, the heat conductivity is low, and the heat radiation is mediocre, as the magnetic field is not applied, and boron nitride powder is not orientated in a given direction.

As the embodiments 1 to 12, in the heat conductive adhesive film of the invention, boron nitride powder is orientated in a given direction of the thickness direction by impressing a magnetic field, the heat conductivity is high, the heat radiation is excellent, and the electric insulation and the peeling-off strength are also good. As evident from the embodiments 13 and 14, the electric component adhered by the heat conductive adhesive film having boron nitride powder orientated in a given direction can be applied to the adhesion between a semiconductor package of high calorific value and a heat sink or other radiator, or to the adhesion between a semiconductor chip and a die pad section, for providing a useful electronic component presenting a low heat resistance and an excellent heat radiation characteristics.

What is claimed is:

1. A heat conductive adhesive film, wherein boron nitride powder is oriented in a given direction in a solid state adhesive, the solid state adhesive is at least one kind of adhesive selected from epoxy, polyimide, acrylic, vinylic, urethane, silicone, or styrenic thermoplastic elastomer base material, and the solid state adhesive is thermosetting and in a half-set state.

2. The heat conductive adhesive film of claim 1, wherein: the concentration of boron nitride powder in the heat conductive adhesive film is 2 to 80 volume %.

3. A manufacturing method of heat conductive adhesive film, wherein: a magnetic field is applied to a film composition having boron nitride powder to orientate and solidify the boron nitride powder in a given direction in a solid state adhesive, the solid state adhesive is at least one kind of adhesive selected from epoxy, polyimide, acrylic, vinylic, urethane, silicone, or styrenic thermoplastic elastomer base material, and the solid state adhesive is thermosetting and in a half-set state.

4. An electronic component, wherein: a heat radiating element and a heat conductive member are adhered by a hut conductive adhesive film in which boron nitride powder is oriented in a given direction in a solid state adhesive which is thermosetting and in a half-set state, the solid state adhesive is at least one kind of adhesive selected from epoxy, polyimide, acrylic, vinylic, urethane, silicone, or styrenic thermoplastic elastomer base material.

5. A heat conductive adhesive film, wherein boron nitride powder is oriented in a given direction in a solid state adhesive, the solid state adhesive is thermosetting and in a half-set state.

6. The heat conductive adhesive film of claim 5, wherein the concentration of boron nitride powder in the heat conductive adhesive film is 2 to 80 volume %.

7. A manufacturing method of heat conductive adhesive film, wherein a magnetic field is applied to a film composition having boron nitride powder to orientate and solidify the boron nitride powder in a given direction in a solid state adhesive, the solid state adhesive is thermosetting and in a half-set state.

8. An electronic component, wherein a heat radiating element and a heat conductive member are adhered by a heat conductive adhesive film in which boron nitride powder is oriented in a given direction in a solid state adhesive which is thermosetting and in a half-set state.

9. A method for forming a heat conductive adhesive film, the method comprising the steps of:
   providing and combining uncured adhesive raw material;
   mixing boron nitride powder into said uncured adhesive raw material;
   forming said uncured adhesive raw material with said boron nitride powder into a film;
   applying a magnetic field to said film of said uncured adhesive raw material and said boron nitride powder to orient said boron nitride powder in a predetermined direction of said film;
   curing said film during said applying of said magnetic field to cause said uncured adhesive raw material and said boron nitride powder to form an adhesive.

* * * * *